United States Patent
Chiang (10) Patent No.: US 7,227,249 B1
(45) Date of Patent: Jun. 5, 2007

(54) THREE-DIMENSIONAL STACKED SEMICONDUCTOR PACKAGE WITH CHIPS ON OPPOSITE SIDES OF LEAD

(75) Inventor: Cheng-Lien Chiang, Taipei (TW)

(73) Assignee: Bridge Semiconductor Corporation, Taipei (TW)

( * ) Notice: Subject to any disclaimer, the term of this patent is extended or adjusted under 35 U.S.C. 154(b) by 315 days.

(21) Appl. No.: 11/021,313

(22) Filed: Dec. 22, 2004

Related U.S. Application Data (60) Provisional application No. 60/532,790, filed on Dec. 24, 2003.

(51) Int. Cl.
*H01L 23/02* (2006.01)
*H01L 23/28* (2006.01)
*H01L 23/48* (2006.01)
*H01L 23/495* (2006.01)
*H01L 25/10* (2006.01)

(52) U.S. Cl. .............. 257/686; 257/E23.052; 257/E23.039; 257/E23.069; 257/E23.068; 257/E23.174; 257/E23.178; 257/777; 257/723; 257/725; 257/728; 257/696; 257/698; 257/691; 257/684; 257/796; 257/676; 257/666; 257/784; 257/786; 257/787

(58) Field of Classification Search ........ 257/E23.068, 257/E23.069, E23.174, E23.178, E23.052, 257/E23.039, 777, 723, 684–686, 725, 728, 257/676, 666, 696, 698, 691, 784, 786, 787, 257/796
See application file for complete search history.

(56) References Cited

U.S. PATENT DOCUMENTS

| | | | |
|---|---|---|---|
| 4,706,166 A | 11/1987 | Go | 361/403 |
| 4,807,021 A | 2/1989 | Okumura | 357/75 |
| 4,897,708 A | 1/1990 | Clements | 357/65 |
| 4,954,875 A | 9/1990 | Clements | 357/75 |
| 4,984,358 A | 1/1991 | Nelson | 29/830 |
| 4,996,583 A | 2/1991 | Hatada | 357/70 |
| 5,049,979 A | 9/1991 | Hashemi et al. | 357/75 |
| 5,104,820 A | 4/1992 | Go et al. | 437/51 |
| 5,138,438 A | 8/1992 | Masayuki et al. | 357/75 |
| 5,299,092 A * | 3/1994 | Yaguchi et al. | 361/728 |
| 5,332,922 A * | 7/1994 | Oguchi et al. | 257/723 |
| 5,394,303 A | 2/1995 | Yamaji | 361/749 |
| 5,484,959 A | 1/1996 | Burns | 174/524 |
| 5,514,907 A | 5/1996 | Moshayedi | 257/723 |
| 5,594,275 A | 1/1997 | Kwon et al. | 257/686 |
| 5,625,221 A | 4/1997 | Kim et al. | 257/686 |
| 5,656,856 A | 8/1997 | Kweon | 257/686 |
| 5,689,135 A * | 11/1997 | Ball | 257/676 |
| 5,744,827 A | 4/1998 | Jeong et al. | 257/686 |
| 5,804,874 A * | 9/1998 | An et al. | 257/676 |
| 5,854,507 A | 12/1998 | Miremadi et al. | 257/686 |
| 5,910,685 A | 6/1999 | Watanabe et al. | 257/777 |
| 5,973,393 A | 10/1999 | Chia et al. | 257/690 |
| 6,002,167 A * | 12/1999 | Hatano et al. | 257/696 |
| 6,072,233 A | 6/2000 | Corisis et al. | 257/686 |
| 6,084,309 A * | 7/2000 | Kawashima et al. | 257/778 |
| 6,087,222 A * | 7/2000 | Jung Lin et al. | 438/259 |
| 6,087,718 A * | 7/2000 | Cho | 257/686 |
| 6,124,633 A | 9/2000 | Vindasius et al. | 257/685 |

(Continued)

*Primary Examiner*—Alexander Oscar Williams
(74) *Attorney, Agent, or Firm*—David M. Sigmond (57) ABSTRACT

A three-dimensional stacked semiconductor package includes first and second chips, first and second adhesives, first and second wire bonds, a lead and an encapsulant. The chips are disposed on opposite sides of the lead, and the wire bonds contact the same side of the lead.

60 Claims, 5 Drawing Sheets

U.S. PATENT DOCUMENTS

| | | | |
|---|---|---|---|
| 6,137,163 A | 10/2000 | Kim et al. | 257/686 |
| 6,165,819 A * | 12/2000 | Seki et al. | 438/123 |
| 6,175,149 B1 * | 1/2001 | Akram | 257/676 |
| 6,180,881 B1 | 1/2001 | Isaak | 174/52.4 |
| 6,188,127 B1 | 2/2001 | Senba et al. | 257/686 |
| 6,190,944 B1 | 2/2001 | Choi | 438/109 |
| 6,232,213 B1 * | 5/2001 | King et al. | 438/613 |
| 6,235,554 B1 | 5/2001 | Akram et al. | 438/109 |
| 6,303,997 B1 | 10/2001 | Lee | 257/778 |
| 6,335,565 B1 | 1/2002 | Miyamoto et al. | 257/686 |
| 6,479,321 B2 | 11/2002 | Wang et al. | 438/109 |
| 6,483,181 B2 * | 11/2002 | Chang et al. | 257/686 |
| 6,483,718 B2 | 11/2002 | Hashimoto | 361/803 |
| 6,492,718 B2 | 12/2002 | Ohmori | 257/686 |
| 6,501,165 B1 | 12/2002 | Farnworth et al. | 257/686 |
| 6,504,241 B1 | 1/2003 | Yanagida | 257/686 |
| 6,509,639 B1 | 1/2003 | Lin | 257/686 |
| 6,564,454 B1 | 5/2003 | Glenn et al. | 29/852 |
| 6,608,371 B2 | 8/2003 | Kurashima et al. | 257/686 |
| 6,744,121 B2 * | 6/2004 | Chang et al. | 257/668 |
| 6,794,741 B1 | 9/2004 | Lin et al. | 257/686 |
| 2002/0153599 A1 | 10/2002 | Chang et al. | 257/676 |
| 2003/0011052 A1 * | 1/2003 | Kim | 257/673 |

* cited by examiner

THREE-DIMENSIONAL STACKED SEMICONDUCTOR PACKAGE WITH CHIPS ON OPPOSITE SIDES OF LEAD

CROSS-REFERENCE TO RELATED APPLICATIONS

This application claims the benefit of U.S. Provisional Application Ser. No. 60/532,790 filed Dec. 24, 2003, which is incorporated by reference.

BACKGROUND OF THE INVENTION

1. Field of the Invention

The present invention relates to semiconductor packaging, and more particularly to a three-dimensional stacked semiconductor package with multiple semiconductor chips and its method of manufacture.

2. Description of the Related Art

In the field of electronic systems, there is a continuous need to increase performance and reduce size. This is largely achieved by improving semiconductor wafer manufacturing and semiconductor packaging technologies. Wafer manufacturing involves simultaneously fabricating numerous semiconductor chips as a batch on a silicon wafer using various etching, doping and depositing steps. After the wafer is complete, the chips are separated from one another and packaged.

Wafer manufacturing strives to reduce transistor or capacitor feature size in order to increase circuit density and enhance functionality. Device geometries with sub-micron line widths are so common that individual chips routinely contain millions of electronic devices. Reduced feature size has been quite successful in improving electronic systems, and continuous development is expected in the future. However, significant obstacles to further reduction in feature size are being encountered. These obstacles include defect density control, optical system resolution limits, and availability of processing material and equipment. Attention has therefore increasingly shifted to semiconductor packaging as a means to fulfill the relentless demands for enhanced system performance.

Semiconductor chips have input/output pads that must be connected to external circuitry in order to function as part of an electronic system. Traditionally, a single chip is individually housed in a single-chip package that is connected to other single-chip packages through a printed circuit board (or motherboard) which supplies power to the chips and provides signal routing among the chips. The single-chip package has connection media that is typically an array of metallic leads (e.g., a lead frame) or a support circuit (e.g., a substrate).

Several connection techniques are widely used for connecting the chip pads and the connection media. These include wire bonding, tape automated bonding (TAB) and flip-chip bonding. Wire bonding is by far the most common. In this approach, wires are bonded, one at a time, from the chip to external circuitry by thermocompression, thermosonic or ultrasonic processes. TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface. Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Many variations exist on these basic methods.

A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used. While flip-chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost. Thus, none of these conventional connection techniques are entirely satisfactory.

Conventional single-chip packages typically have an area (or footprint) that is many times larger than the area of the chip, causing the printed circuit board to have excessively large area relative to the chips. However, as chip speeds increase, it becomes critical to position the chips close together since excessive signal transmission distance deteriorates signal integrity and propagation times. Other considerations such as manufacturing cost, reliability, heat transfer, moisture resistance, mounting and interconnect standardization, testability, and quality control have also become focal points of chip packaging.

Single-chip packages such as ball grid arrays (BGA) and chip scale packages (CSP) have been recently developed to address these considerations. Although these packages provide certain advantages, further size reduction and performance enhancement with these packages has been difficult to obtain due to physical dimension, design and manufacturing constraints.

Multi-chip modules (MCM) or hybrid modules that package multiple chips on a common platform are an alternative to single-chip packages. These modules aim to achieve higher packaging density (lower volume and mass per chip), better signal integrity and reasonable manufacturing cost. Conventional multi-chip modules are essentially two-dimensional structures with multiple chips connected to a planar interconnection substrate which contains traces to supply power and signal transmission. Co-fired ceramic substrates have given way to organic-based substrates due to performance and cost advantages. However, since multi-chip modules utilize a planar interconnection substrate as the base, their effectiveness in packaging density is limited. For instance, a substrate transmission line that is 25 microns wide, 5 microns high and 10 millimeters long creates high line resistance and signal delays, which necessitates complex wiring rules in order to provide acceptable signal transmission distances and reasonable propagation delays.

Therefore, in order to create higher density packages, reduce area requirements and shorten signal transmission distances, three-dimensional packages with two, three or more vertically stacked chips are an emerging trend. Three-dimensional packages are particularly suitable for the electronic systems such as supercomputers and large cache memory devices which require high operating speed and high capacity in very limited space.

Three-dimensional packages generally follow two approaches. In one approach, individual chips are packaged in conventional single-chip packages and then the single-chip packages are vertically stacked and interconnected to one another. Single-chip packages stacked this way include thin small-outline packages (TSOP), ball grid arrays (BGA) and tape chip packages (TCP), and chip connections within the single-chip packages include wire bonding, TAB and flip-chip bonding. In another approach, leads are connected to the chips, and then the exposed leaded chips are vertically stacked and interconnected to one another. Most three-dimensional packages involve peripheral interconnection, but some provide area array interconnection. Numerous three-dimensional packages are reported in the literature.

U.S. Pat. Nos. 5,484,959, 5,514,907, 5,625,221 and 5,744,827 disclose three-dimensional packages in which stacked single-chip packages have large footprints that require large amounts of space. The single-chip packages also have long extended leads and associated wire bonds that limit electrical performance.

U.S. Pat. Nos. 5,854,507 and 6,072,233 disclose three-dimensional packages with stacked single-chip packages in which solder balls provide the primary vertical interconnections. The solder balls require large amounts of space.

U.S. Pat. No. 5,394,303 discloses a three-dimensional package in which the stacked single-chip packages include a flexible film with wiring layers wrapped around the chip. The flexible film is relatively difficult to wrap and bending the wiring layers causes low yields.

U.S. Pat. Nos. 4,996,583, 5,138,438 and 5,910,685 disclose three-dimensional packages in which TAB leads are connected to and extend beyond the peripheries of the chips, the exposed chips are stacked together and the TAB leads are connected together. The TAB leads for different chips have different shapes and lengths which complicates manufacturing. Furthermore, the TAB leads are interconnected by applying thermocompression, which also complicates manufacturing.

U.S. Pat. Nos. 4,706,166 and 5,104,820 disclose three-dimensional packages in which chips are formed with leads that extend to the sidewalls, the exposed chips are stacked together, and then thin film routing lines are deposited on the sidewalls to interconnect the leads. The wafer process must be modified, and aligning the sidewalls and forming the routing lines on the leads is difficult.

U.S. Pat. Nos. 4,897,708 and 4,954,875 disclose three-dimensional packages composed of wafers rather than individual chips. Cone-shaped vias are formed in the wafers, electrically conductive material is filled in the vias which contacts the pads on the wafers, and the wafers are stacked such that the electrically conductive material in the vias provides vertical interconnections between the pads. The wafer stacks are difficult to separate for repairs and too large for many applications.

Another drawback with many conventional three-dimensional packages is that the vertical interconnections lack the flexibility to accommodate thickness variations of the stacked assemblies. For instance, chip thickness may vary by 20 microns or more even after back-side wafer polishing attempts to planarize the wafer. As a result, vertical interconnections with fixed heights cannot adequately accommodate these thickness variations, and suffer from disoriented, cracked and open connections, high mechanical stress and reliability problems.

In summary, conventional three-dimensional packages suffer from numerous deficiencies including large area requirements, inflexible vertical interconnections, limited electrical performance, poor structural strength and low reliability. Moreover, conventional three-dimensional packages are often unsuitable for test and repair, manufactured by complicated processes that are impractical for volume production, and too difficult and costly to develop.

In view of the various development stages and limitations in currently available three-dimensional packages, there is a need for a three-dimensional package that is cost-effective, reliable, manufacturable, ultra-thin and provides excellent mechanical and electrical performance.

SUMMARY OF THE INVENTION

An object of the present invention is to provide a three-dimensional stacked semiconductor package that provides a low cost, ultra-thin, high performance, high reliability package.

Generally speaking, the present invention provides a three-dimensional stacked semiconductor package that includes first and second chips, first and second adhesives, first and second wire bonds, a lead and an encapsulant. The chips are disposed on opposite sides of the lead, and the wire bonds contact the same side of the lead.

In accordance with an aspect of the invention, a three-dimensional stacked semiconductor package includes:

(1) a lead that includes an inner lead portion, an outer lead portion, an inner distal end, an outer distal end and first and second opposing surfaces, wherein the inner lead portion is adjacent to the inner distal end and spaced from the outer distal end, the outer lead portion is adjacent to the outer distal end and spaced from the inner distal end, the inner and outer lead portions are adjacent to and integral with one another, the first surface of the lead faces in a first direction, the second surface of the lead faces in a second direction opposite the first direction, and the first and second surfaces of the lead extend across the inner and outer lead portions, (2) a first semiconductor chip that includes first and second opposing surfaces, wherein the first surface of the first chip includes a first conductive pad, the first surface of the first chip faces in the first direction, the second surface of the first chip faces in the second direction, the first chip is disposed vertically beyond the inner lead portion in the first direction, the second surface of the first chip and the first surface of the inner lead portion face towards one another, the inner lead portion extends within and outside a periphery of the first chip and the outer lead portion is disposed outside the periphery of the first chip, (3) a second semiconductor chip that includes first and second opposing surfaces, wherein the first surface of the second chip includes a second conductive pad, the first surface of the second chip faces in the first direction, the second surface of the second chip faces in the second direction, the second chip is disposed vertically beyond the inner lead portion in the second direction, the first surface of the second chip and the second surface of the inner lead portion face towards one another, the inner lead portion extends within and outside a periphery of the second chip, the outer lead portion is disposed outside the periphery of the second chip and the first chip vertically overlaps the second chip, (4) a first insulative adhesive that contacts and is sandwiched between the second surface of the first chip and the first surface of the inner lead portion, (5) a second insulative adhesive that contacts and is sandwiched between the first surface of the second chip and the second surface of the inner lead portion, (6) a first wire bond that contacts and electrically connects the first pad and the first surface of the inner lead portion, wherein the first wire bond extends vertically beyond the first chip in the first and second directions, is disposed vertically beyond the second chip in the first direction, extends within and outside the peripheries of the first and second chips, contacts the inner lead portion at a first bond site outside the peripheries of the first and second chips and extends vertically beyond the inner lead portion in the first direction but not the second direction, (7) a second wire bond that contacts and electrically connects the second pad and the first surface of the inner lead portion, wherein the second wire bond is disposed vertically beyond the first chip in the second direction, extends vertically beyond the second chip in the first direction but not the second direction, is disposed within the peripheries of the first and second chips, contacts the inner lead portion at a second bond site within the peripheries of the first and second chips and extends vertically beyond the inner lead portion in the first and second directions, and the first bond site is laterally spaced from and coplanar with the second bond site, and (8) an encapsulant that contacts the first and second chips, the first and second adhesives and the first wire bond.

The inner lead portion can be unbent in the first and second directions, and can be flat. Likewise, the first and second surfaces of the inner lead portion can be flat. The outer lead portion can be bent in the first and second directions and not flat. The outer lead portion can also protrude from the encapsulant.

The second chip can be uncovered by any insulative material of the package in the second direction. In addition, the second surface of the second chip can be laterally aligned with the encapsulant and be exposed or unexposed.

The first adhesive can contact or be spaced from the second chip, and can vertically overlap or not overlap the second pad. The first adhesive can also be spaced from the first wire bond, contact the second adhesive and the second wire bond and be substantially thicker than the second adhesive. The second adhesive can be spaced from the first and second wire bonds.

The first wire bond can be spaced from the first and second adhesives and extend a substantially smaller distance in the first direction than the second wire bond. The second wire bond can contact the first adhesive and be spaced from the second adhesive.

The encapsulant can be a single-piece insulative material that covers and extends vertically beyond the first and second chips, the first and second adhesives and is the first and second wire bonds in the first direction. The encapsulant can also contact or be spaced from the second wire bond.

An advantage of the present invention is that the package can be an ultra-thin, first-level, multi-chip module and can be directly mounted on a printed circuit board. Another advantage is that the package can accommodate chips with varying sizes and thickness while maintaining reliable electrical connections. Another advantage is that the package can be leaded package such as a thin small-outline package (TSOP) or quad flat package (QFP). Another advantage is that the package can be manufactured conveniently and cost effectively.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1:
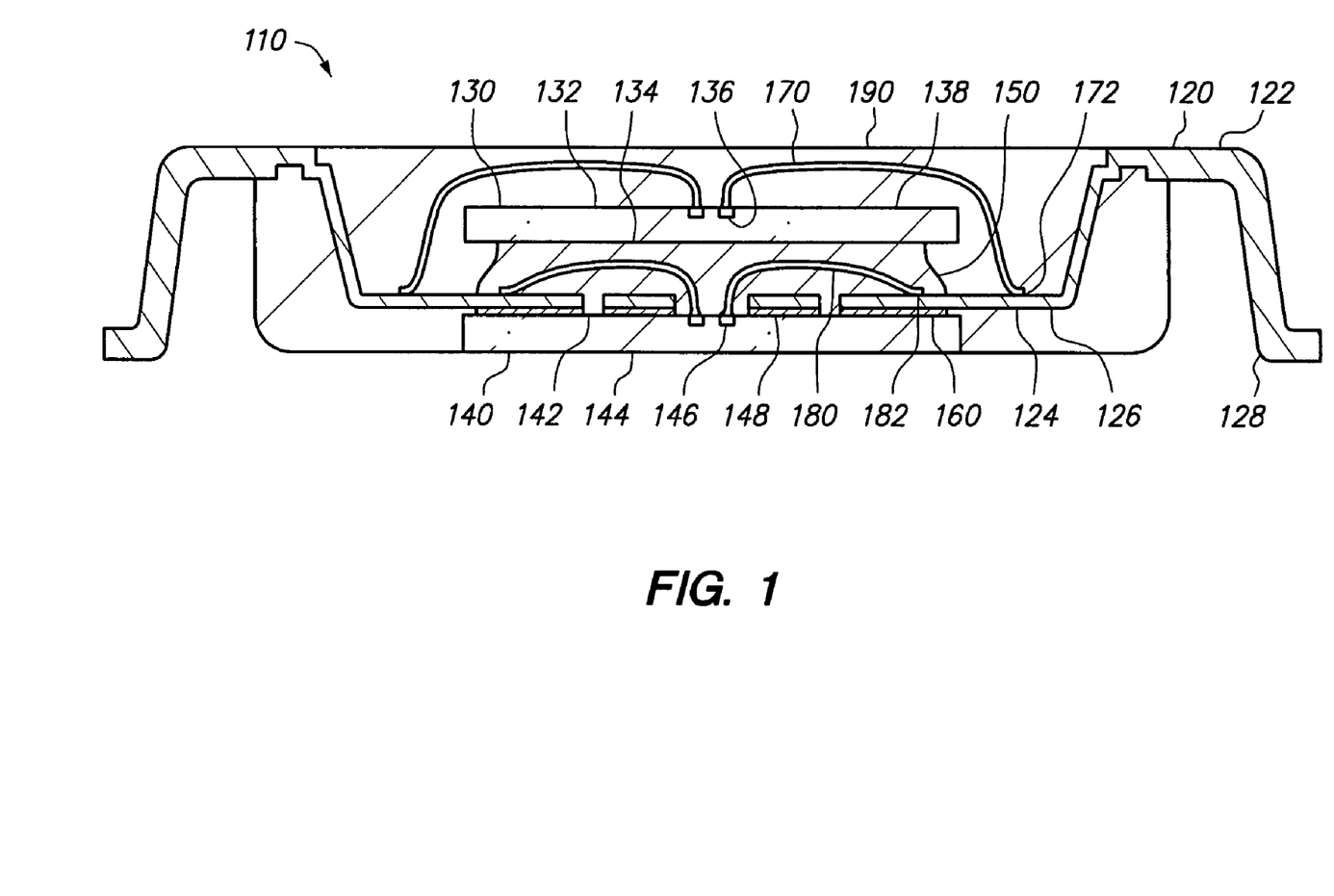
FIG. 1 is a cross-sectional view of a three-dimensional stacked semiconductor package in accordance with a first embodiment of the present invention.

FIG. 1 is a cross-sectional view of a three-dimensional stacked semiconductor package in accordance with a first embodiment of the present invention.

Three-dimensional stacked semiconductor package 110 includes lead 120, chips 130 and 140, adhesives 150 and 160, wire bonds 170 and 180 and encapsulant 190.

Lead 120 is a copper trace that includes opposing major surfaces 122 and 124, inner lead portion 126 and outer lead portion 128. Surface 122 faces in the upward direction, and surface 124 faces in the downward direction. Furthermore, surfaces 122 and 124 extend across inner lead portion 126 and outer lead portion 128. Inner lead portion 126 is adjacent to the inner distal end of lead 120 and spaced from the outer distal end of lead 120, and outer lead portion 128 is adjacent to the outer distal end of lead 120 and spaced from the inner distal end of lead 120. Furthermore, inner lead portion 126 and outer lead portion 128 are adjacent to and integral with one another. Inner lead portion 126 is flat and unbent in the upward and downward directions, and outer lead portion 128 is bent in the upward and downward directions. Inner lead portion 126 extends within and outside the peripheries of chips 130 and 140, and outer lead portion 128 is disposed outside the peripheries of chips 130 and 140. Inner lead portion 126 is surrounded by encapsulant 190, and outer lead portion 128 protrudes from encapsulant 190. Lead 120 is in a lead frame that includes many other leads with inner and outer lead portions, and only lead 120 and another lead (unlabeled) are shown for convenience of illustration.

Chip 130 is a dynamic random access memory (DRAM) integrated circuit in which various transistors, circuits, interconnect lines and the like are formed (not shown). Chip 130 includes opposing major surfaces 132 and 134. Surface 132 is the active surface and includes conductive pad 136 and passivation layer 138. Pad 136 provides a bonding site to electrically couple chip 130 with external circuitry and can be an input/output pad or a power/ground pad. Surface 132 faces in the upward direction, and surface 134 faces in the downward direction. Chip 130 is disposed upwardly beyond inner lead portion 126, and surface 122 of inner lead portion 126 and surface 134 of chip 130 face towards one another. In addition, chip 130 is vertically aligned with and overlaps and is identical to chip 140. Chip 130 includes many other center pads on surface 132, and only pad 136 and another pad (unlabeled) are shown for convenience of illustration.

Chip 140 is a dynamic random access memory (DRAM) integrated circuit in which various transistors, circuits, interconnect lines and the like are formed (not shown). Chip 140 includes opposing major surfaces 142 and 144. Surface 142 is the active surface and includes conductive pad 146 and passivation layer 148. Pad 146 provides a bonding site to electrically couple chip 140 with external circuitry and can be an input/output pad or a power/ground pad. Surface 142 faces in the upward direction, and surface 144 faces in the downward direction. Chip 140 is disposed downwardly beyond inner lead portion 126, and surface 124 of inner lead portion 126 and surface 142 of chip 140 face towards one another. In addition, surface 144 of chip 140 is laterally aligned with encapsulant 190 and completely exposed. Thus, chip 140 is not covered by any insulative material of package 110 in the downward direction. Chip 140 includes many other center pads on surface 142, and only pad 146 and another pad (unlabeled) are shown for convenience of illustration.

Adhesive 150 is an insulative thermosetting polyimide layer that contacts and is sandwiched between surface 122 of inner lead portion 126 and surface 134 of chip 130. Adhesive 150 also contacts chip 140, adhesive 160, wire bond 180 and encapsulant 190, is spaced from wire bond 170 and vertically overlaps pad 146. Adhesive 150 also contacts and is sandwiched between inner lead portion 126 and wire bond 180, between chips 130 and 140, between chip 140 and wire bond 180, and between adhesive 160 and wire bond 180. Furthermore, adhesive 150 is substantially thicker than adhesive 160.

Adhesive 160 is an insulative thermosetting polyimide layer that contacts and is sandwiched between surface 124 of inner lead portion 126 and surface 142 of chip 140. Furthermore, adhesive 160 is spaced from chip 130 and wire bonds 170 and 180.

Wire bond 170 is a gold wire that contacts and electrically connects surface 122 of inner lead portion 126 and pad 136. Wire bond 170 extends upwardly and downwardly beyond chip 130, is disposed upwardly beyond chip 140, extends within and outside the peripheries of chips 130 and 140, contacts inner lead portion 126 at bond site 172 outside the peripheries of chips 130 and 140 and extends upwardly but not downwardly beyond inner lead portion 126. Furthermore, wire bond 170 extends upwardly a substantially smaller distance than wire bond 180 but extends laterally a substantially larger distance than wire bond 180.

Wire bond 180 is a gold wire that contacts and electrically connects surface 122 of inner lead portion 126 and pad 146. Wire bond 180 is disposed downwardly beyond chip 130, extends upwardly but not downwardly beyond chip 140, is disposed within (and thus does not extend outside) the peripheries of chips 130 and 140, contacts inner lead portion 126 at bond site 182 within the peripheries of the chips 130 and 140 and extends upwardly and downwardly beyond inner lead portion 126. Wire bond 180 is covered by chip 130 in the upward direction and is covered by chip 140 in the downward direction. Furthermore, bond site 172 is laterally spaced from and coplanar with bond site 182.

Encapsulant 190 is a transfer molded single-piece insulative material that contacts inner lead portion 126, outer lead portion 128, chips 130 and 140, adhesives 150 and 160 and wire bond 170 and is spaced from wire bond 180. Encapsulant 190 also covers and extends upwardly beyond inner lead portion 126, chips 130 and 140, adhesives 150 and 160 and wire bonds 170 and 180 (but not outer lead portion 128), extends downwardly beyond inner lead portion 126, chip 130, adhesives 150 and 160 and wire bonds 170 and 180 (but not outer lead portion 128 or chip 140), and extends laterally beyond inner lead portion 126, chips 130 and 140, adhesives 150 and 160 and wire bonds 170 and 180 (but not outer lead portion 128). Thus, encapsulant 190 provides the package body.

Package 110 includes other leads and wire bonds embedded in encapsulant 190 that are not shown for convenience of illustration. The leads are spaced and separated and electrically isolated from and coplanar with one another. The leads each include a respective inner lead portion and outer lead portion. The leads are each electrically connected to a respective pad on chip 130 by a respective upper wire bond and to a respective pad on chip 140 by a respective lower wire bond. The leads each extend within and outside the peripheries of chips 130 and 140 at the inner lead portions and protrude from encapsulant 190 at the outer lead portions to provide horizontal fan-out routing and vertical routing for their respective pads. The upper wire bonds each extend upwardly and downwardly beyond chip 130, are disposed upwardly beyond chip 140, extend within and outside the peripheries of chips 130 and 140, contact the respective inner lead portions at bond sites outside the peripheries of chips 130 and 140 and extend upwardly but not downwardly beyond the inner lead portions. The lower wire bonds each are disposed downwardly beyond chip 130, extend upwardly but not downwardly beyond chip 140, are disposed within the peripheries of chips 130 and 140, contact the respective inner lead portions at bond sites within the peripheries of the chips 130 and 140 and extend upwardly and downwardly beyond the inner lead portions. Furthermore, the bond sites where the upper and lower wire bonds contact the inner lead portion are laterally spaced from and coplanar with one another. As a result, package 110 is an ultra-thin, first-level, multi-chip, lead-on-chip (LOC) stacked package.

Package 110 can be manufactured by the sequential steps of (1) forming the lead frame that includes lead 120 by conventional etching and lead forming techniques, (2) mechanically attaching chip 140 to the lead frame using adhesive 160, (3) electrically connecting chip 140 to the lead frame using the lower wire bonds including wire bond 180, (4) mechanically attaching chip 130 to the lead frame, chip 140, adhesive 160 and the lower wire bonds using adhesive 150, (5) electrically connecting chip 130 to the lead frame using the upper wire bonds including wire bond 170, (6) forming encapsulant 190, and (7) excising and bending the outer lead portions outside encapsulant 190.

Figure 2:
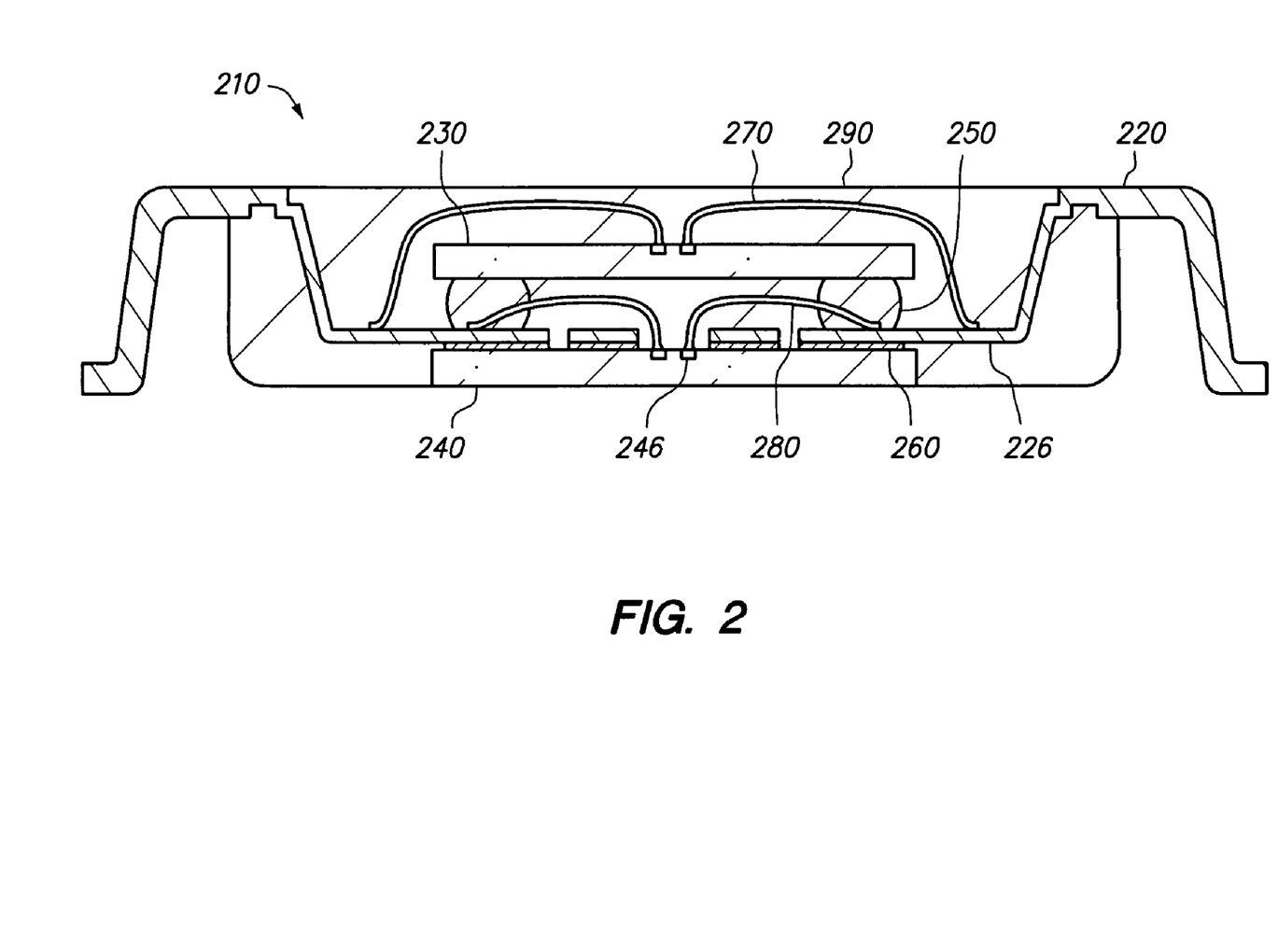
FIG. 2 is a cross-sectional view of a three-dimensional stacked semiconductor package in accordance with a second embodiment of the present invention.

FIG. 2 is a cross-sectional view of a three-dimensional stacked semiconductor package in accordance with a second embodiment of the present invention. In the second embodiment, the upper adhesive is peripheral bonded to the upper chip. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, lead 220 corresponds to lead 120, chip 230 corresponds to chip 130, etc.

Adhesive 250 is disposed proximate to the periphery of chip 230 but spaced from the center of chip 230. As a result, adhesive 250 is spaced from chip 240 and does not vertically overlap pad 246. However adhesive 250 contacts adhesive 260 and wire bond 280. In addition, encapsulant 290 contacts chip 240 and wire bond 280, and contacts and is sandwiched between chips 230 and 240, between chip 240 and wire bond 280, and between adhesive 260 and wire bond 280.

Three-dimensional stacked semiconductor package 210 includes lead 220, chips 230 and 240, adhesives 250 and 260, wire bonds 270 and 280 and encapsulant 290.

Figure 3:
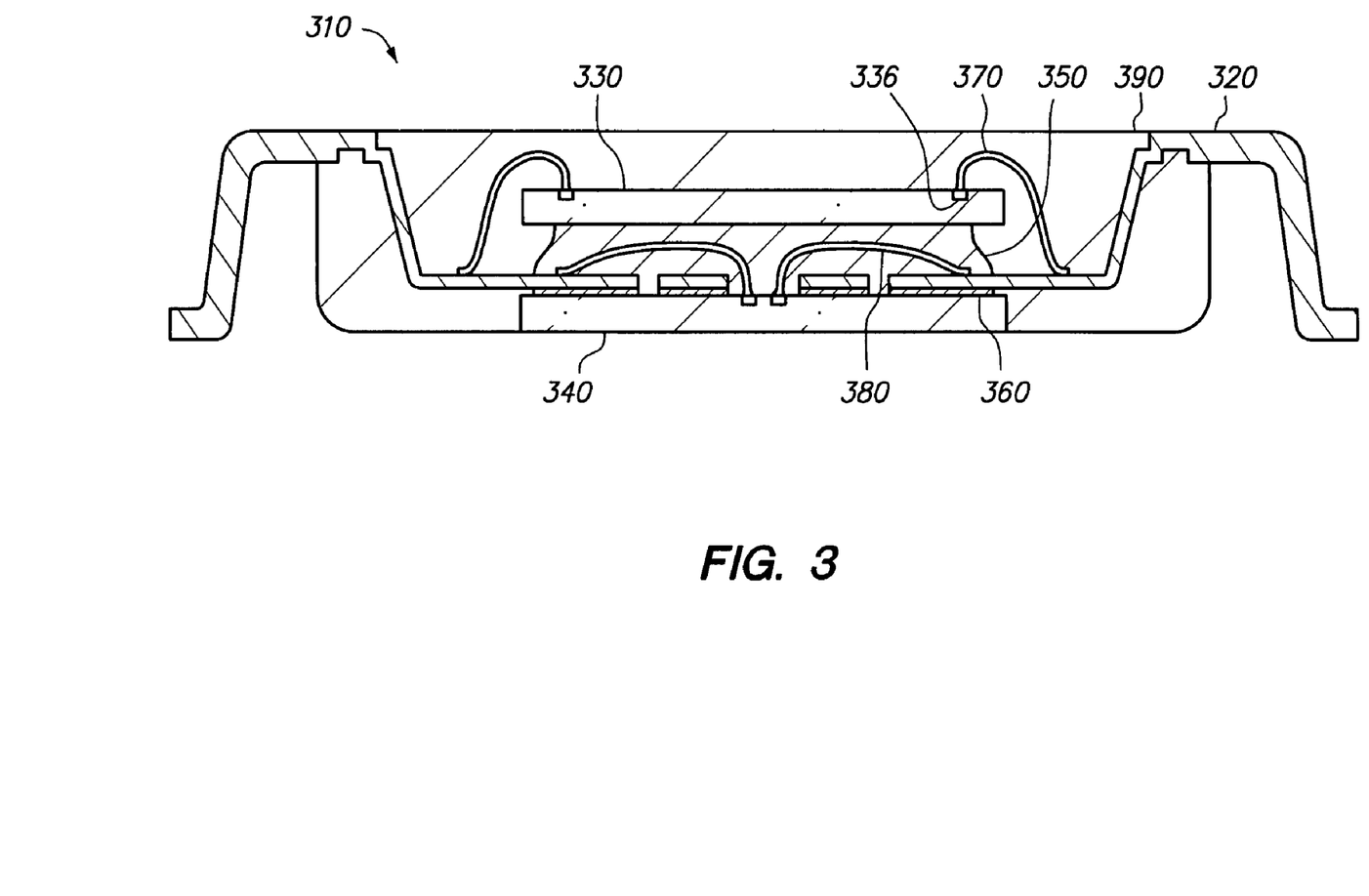
FIG. 3 is a cross-sectional view of a three-dimensional stacked semiconductor package in accordance with a third embodiment of the present invention.

FIG. 3 is a cross-sectional view of a three-dimensional stacked semiconductor package in accordance with a third embodiment of the present invention. In the third embodiment, the upper chip has peripheral pads. For purposes of brevity, any description in the first embodiment is incorporated herein insofar as the same is applicable, and the same description need not be repeated. Likewise, elements of the third embodiment similar to those in the first embodiment have corresponding reference numerals indexed at three-hundred rather than one-hundred. For instance, lead 320 corresponds to lead 120, chip 330 corresponds to chip 130, etc.

Chip 330 is flash memory (rather than DRAM) and pad 336 (and the other pads of chip 330) are peripheral pads (rather than center pads). As a result, wire bond 370 (and the other upper wire bonds) are peripheral bonded (rather than center bonded) to chip 330.

Three-dimensional stacked semiconductor package 310 includes lead 320, chips 330 and 340, adhesives 350 and 360, wire bonds 370 and 380 and encapsulant 390.

Figure 4:
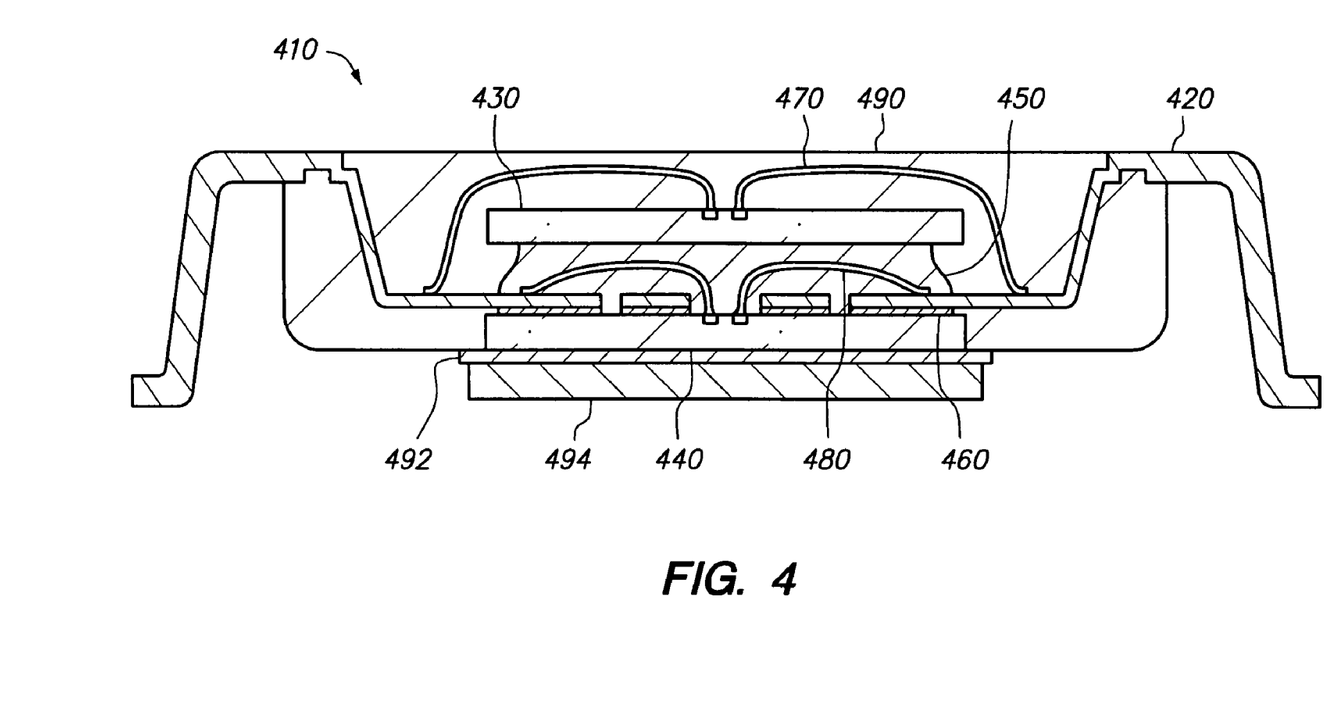
FIG. 4 is a cross-sectional view of a three-dimensional stacked semiconductor package in accordance with a fourth embodiment of the present invention.

FIG. 4 is a cross-sectional view of a three-dimensional stacked semiconductor package in accordance with a fourth embodiment of the present invention. In the fourth embodiment, the package includes a heat sink. For purposes of brevity, any description in the first embodiment is incorporated herein insofar as the same is applicable, and the same description need not be repeated. Likewise, elements of the fourth embodiment similar to those in the first embodiment have corresponding reference numerals indexed at four-hundred rather than one-hundred. For instance, lead 420 corresponds to lead 120, chip 430 corresponds to chip 130, etc.

Insulative base 492 is a high thermal conductivity adhesive such as Hysol QMI 536HT with a thickness of 25 microns, and heat sink 494 is a copper plate with a thickness of 150 microns covered in the downward direction by a nickel coating with a thickness of 2 microns to reduce corrosion. For convenience of illustration, the copper plate and the nickel coating are shown as a single layer. Insulative base 492 and heat sink 494 cover chip 440 in the downward direction, and therefore chip 440 is not exposed in the downward direction. Package 410 is thicker than package 110 but has better back-side thermal conductivity than package 110.

Three-dimensional stacked semiconductor package 410 includes lead 420, chips 430 and 440, adhesives 450 and 460, wire bonds 470 and 480, encapsulant 490, insulative base 492 and heat sink 494.

Figure 5:
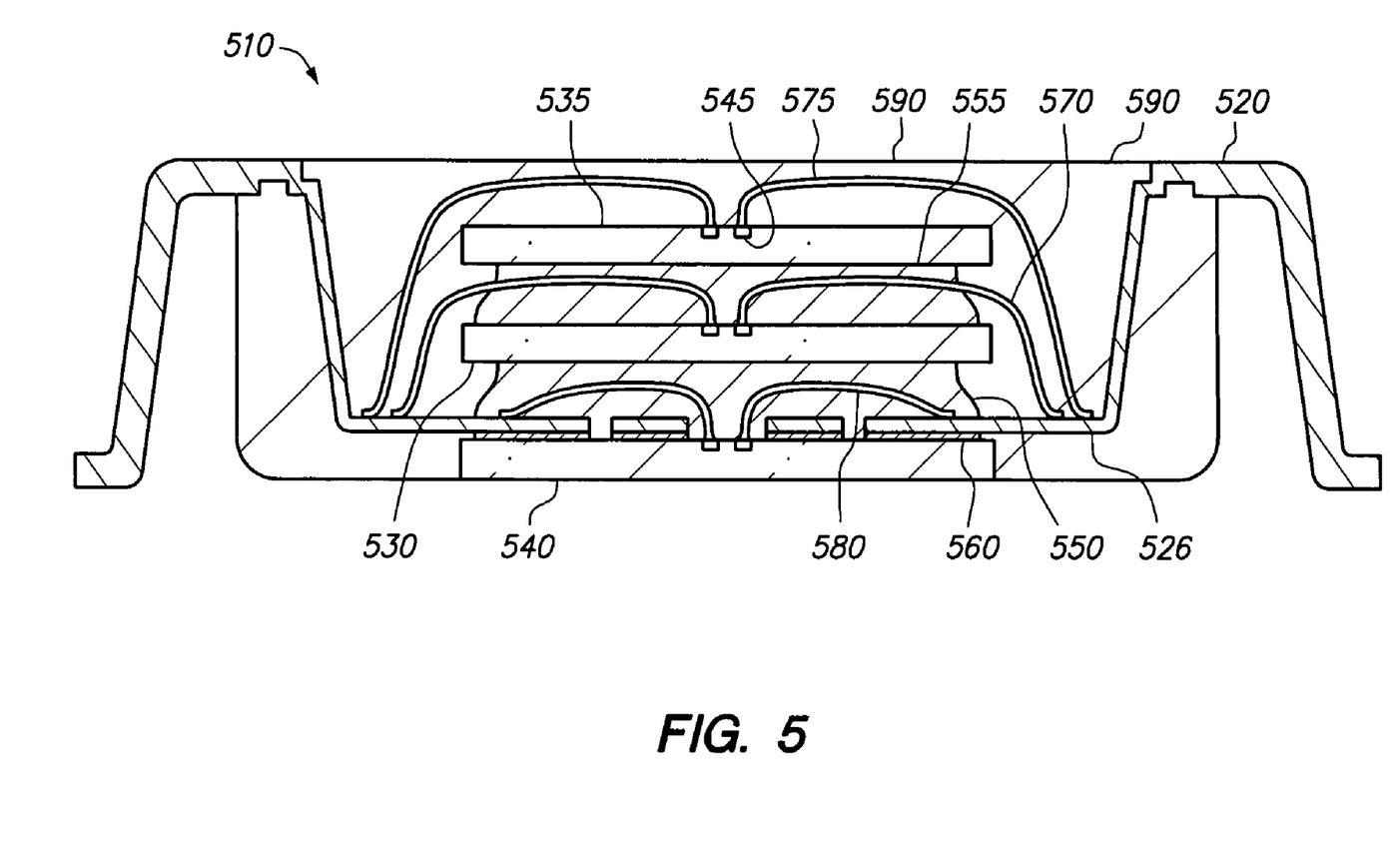
FIG. 5 is a cross-sectional view of a three-dimensional stacked semiconductor package in accordance with a fifth embodiment of the present invention.

FIG. 5 is a cross-sectional view of a three-dimensional stacked semiconductor package in accordance with a fifth embodiment of the present invention. In the fifth embodiment, the package includes a third chip. For purposes of brevity, any description in the first embodiment is incorporated herein insofar as the same is applicable, and the same description need not be repeated. Likewise, elements of the fifth embodiment similar to those in the first embodiment have corresponding reference numerals indexed at five-hundred rather than one-hundred. For instance, lead 520 corresponds to lead 120, chip 530 corresponds to chip 130, etc.

Chip 535 is vertically aligned with and overlaps and is identical to chips 530 and 540. Adhesive 555 contacts and is sandwiched between chips 530 and 535. Wire bond 575 contacts and electrically connects inner lead portion 526 and pad 545.

Three-dimensional stacked semiconductor package 510 includes lead 520, chips 530, 535 and 540, adhesives 550, 555 and 560, wire bonds 570, 575 and 580 and encapsulant 590.

The packages described above are merely exemplary. Numerous other embodiments are contemplated. For instance, the encapsulant need not be laterally aligned with the bottom surface of the lower chip. In addition, the embodiments described above can generally be combined with one another. For instance, the upper adhesive in the second embodiment can be used in the other embodiments, the upper chip in the third embodiment can be used in the other embodiments, the heat sink in the fourth embodiment can be used in the other embodiments, and the third chip in the fifth embodiment can be used in the other embodiments. The embodiments described above can be mixed-and-matched with one another and with other embodiments depending on design and reliability considerations.

The "upward" and "downward" vertical directions do not depend on the orientation of the package, as will be readily apparent to those skilled in the art. For instance, the upper chip is disposed vertically beyond the inner lead portion and the lower chip in the "upward" direction, the encapsulant extends vertically beyond the chips, the adhesives and the wire bonds in the "upward" direction, and the lower chip is disposed vertically beyond the inner lead portion and the upper chip in the "downward" direction, regardless of whether the package is inverted and/or mounted on a printed circuit board. Likewise, the bonding sites where the upper and lower wire bonds contact the inner lead portion are "laterally" spaced from one another regardless of whether the package is inverted, rotated or slanted. Thus, the "upward" and "downward" directions are opposite one another and orthogonal to the "lateral" direction, and the "laterally aligned" surfaces are coplanar with one another in a lateral plane orthogonal to the upward and downward directions. Moreover, the upper chip is shown above the inner lead portion and the lower chip, and the inner lead portion is shown above the lower chip with a single orientation throughout the drawings for ease of comparison between the figures, although the package and its components may be inverted at various manufacturing stages.

The working format for the package can be a single package or multiple packages based on the manufacturing design. For instance, a single package can be manufactured individually. Alternatively, numerous packages can be simultaneously batch manufactured on a single lead frame and then separated from one another by excising the leads.

The package can have a wide variety of packaging formats as required by the next level assembly. For instance, the leads can be configured to provide a thin small-outline package (TSOP) or quad flat package (QFP). The package can also be a first-level, multi-chip package that includes two or more chips that are stacked and vertically aligned with one another.

Advantageously, the package of the present invention is reliable and inexpensive. The chips need not be specifically designed for stacking during wafer manufacturing. Furthermore, the package is ultra-thin despite the wire bonds. As a result, the package of the present invention significantly enhances throughput, yield, performance characteristics, standardization and cost-effectiveness compared to conventional packaging techniques.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. A three-dimensional stacked semiconductor package, comprising:
a lead that includes an inner lead portion, an outer lead portion, an inner distal end, an outer distal end and first and second opposing surfaces, wherein the inner lead portion is adjacent to the inner distal end and spaced from the outer distal end, the outer lead portion is adjacent to the outer distal end and spaced from the inner distal end, the inner and outer lead portions are adjacent to and integral with one another, the first surface of the lead faces in a first direction, the second surface of the lead faces in a second direction opposite the first direction, and the first and second surfaces of the lead extend across the inner and outer lead portions;
a first semiconductor chip that includes first and second opposing surfaces, wherein the first surface of the first chip includes a first conductive pad, the first surface of the first chip faces in the first direction, the second surface of the first chip faces in the second direction, the first chip is disposed vertically beyond the inner lead portion in the first direction, the second surface of the first chip and the first surface of the inner lead portion face towards one another, the inner lead portion extends within and outside a periphery of the first chip and the outer lead portion is disposed outside the periphery of the first chip;
a second semiconductor chip that includes first and second opposing surfaces, wherein the first surface of the second chip includes a second conductive pad, the first surface of the second chip faces in the first direction, the second surface of the second chip faces in the second direction, the second chip is disposed vertically beyond the inner lead portion in the second direction, the first surface of the second chip and the second surface of the inner lead portion face towards one another, the inner lead portion extends within and outside a periphery of the second chip, the outer lead portion is disposed outside the periphery of the second chip and the first chip vertically overlaps the second chip;
a first insulative adhesive that contacts and is sandwiched between the second surface of the first chip and the first surface of the inner lead portion;
a second insulative adhesive that contacts and is sandwiched between the first surface of the second chip and the second surface of the inner lead portion;
a first wire bond that contacts and electrically connects the first pad and the first surface of the inner lead portion, wherein the first wire bond extends vertically beyond the first chip in the first and second directions, is disposed vertically beyond the second chip in the first direction, extends within and outside the peripheries of the first and second chips, contacts the inner lead portion at a first bond site outside the peripheries of the first and second chips and extends vertically beyond the inner lead portion in the first direction but not the second direction;
a second wire bond that contacts and electrically connects the second pad and the first surface of the inner lead portion, wherein the second wire bond is disposed vertically beyond the first chip in the second direction, extends vertically beyond the second chip in the first direction but not the second direction, is disposed within the peripheries of the first and second chips, contacts the inner lead portion at a second bond site within the peripheries of the first and second chips, extends vertically beyond the inner lead portion in the first and second directions and contacts the first adhesive, and the first bond site is laterally spaced from and coplanar with the second bond site; and
an encapsulant that contacts the first and second chips, the first and second adhesives and the first wire bond.

2. The stacked package of claim 1, wherein the inner lead portion is unbent in the first and second directions.

3. The stacked package of claim 1, wherein the inner lead portion is flat.

4. The stacked package of claim 1, wherein the first surface of the inner lead portion is flat.

5. The stacked package of claim 1, wherein the second surface of the inner lead portion is flat.

6. The stacked package of claim 1, wherein the first and second surfaces of the inner lead portion are flat.

7. The stacked package of claim 1, wherein the outer lead portion is bent in the first direction within the encapsulant.

8. The stacked package of claim 1, wherein the outer lead portion extends vertically beyond the first chip in the first direction within the encapsulant.

9. The stacked package of claim 1, wherein the outer lead portion is bent in the first direction within the encapsulant, is bent in the second direction outside the encapsulant, extends vertically beyond every chip in the stacked package in the first direction within the encapsulant and extends vertically beyond every chip in the stacked package in the second direction outside the encapsulant.

10. The stacked package of claim 1, wherein the second chip is not covered by any insulative material of the package in the second direction.

11. The stacked package of claim 1, wherein the second surface of the second chip is laterally aligned with the encapsulant.

12. The stacked package of claim 1, wherein the second surface of the second chip is exposed.

13. The stacked package of claim 1, wherein the first adhesive contacts the second chip.

14. The stacked package of claim 1, wherein the first adhesive is spaced from the second chip.

15. The stacked package of claim 1, wherein the first adhesive contacts the second adhesive.

16. The stacked package of claim 1, wherein the first adhesive is spaced from the first wire bond.

17. The stacked package of claim 1, wherein the first adhesive contacts the second chip and is spaced from the first wire bond.

18. The stacked package of claim 1, wherein the first adhesive contacts the second adhesive and is spaced from the first wire bond.

19. The stacked package of claim 1, wherein the first adhesive contacts and is sandwiched between the lead and the second wire bond.

20. The stacked package of claim 1, wherein the first adhesive contacts and is sandwiched between the second chip and the second wire bond.

21. The stacked package of claim 1, wherein the first adhesive contacts and is sandwiched between the second adhesive and the second wire bond.

22. The stacked package of claim 1, wherein the first adhesive is substantially thicker than the second adhesive.

23. The stacked package of claim 1, wherein the second adhesive is spaced from the first and second wire bonds.

24. The stacked package of claim 1, wherein the first wire bond is spaced from the first and second adhesives.

25. The stacked package of claim 1, wherein the first wire bond extends a substantially smaller distance in the first direction than the second wire bond.

26. The stacked package of claim 1, wherein the second wire bond is spaced from the second adhesive.

27. The stacked package of claim 1, wherein the encapsulant is a single-piece insulative material.

28. The stacked package of claim 1, wherein the encapsulant covers and extends vertically beyond the first and second chips, the first and second adhesives and the first and second wire bonds in the first direction.

29. The stacked package of claim 1, wherein the encapsulant contacts the second wire bond.

30. The stacked package of claim 1, wherein the encapsulant is spaced from the second wire bond.

31. A three-dimensional stacked semiconductor package, comprising:
  a lead that includes an inner lead portion, an outer lead portion, an inner distal end, an outer distal end and first and second opposing surfaces, wherein the inner lead portion is adjacent to the inner distal end, spaced from the outer distal end and is flat, the outer lead portion is adjacent to the outer distal end, spaced from the inner distal end and is bent, the inner and outer lead portions are adjacent to and integral with one another, the first surface of the lead faces in a first direction, the second surface of the lead faces in a second direction opposite the first direction, and the first and second surfaces of the lead extend across the inner and outer lead portions;
  a first semiconductor chip that includes first and second opposing surfaces, wherein the first surface of the first chip includes a first conductive pad, the first surface of the first chip faces in the first direction, the second surface of the first chip faces in the second direction, the first chip is disposed vertically beyond the inner lead portion in the first direction, the second surface of the first chip and the first surface of the inner lead portion face towards one another, the inner lead portion extends within and outside a periphery of the first chip and the outer lead portion is disposed outside the periphery of the first chip;
  a second semiconductor chip that includes first and second opposing surfaces, wherein the first surface of the second chip includes a second conductive pad, the first surface of the second chip faces in the first direction, the second surface of the second chip faces in the second direction, the second chip is disposed vertically beyond the inner lead portion in the second direction, the first surface of the second chip and the second surface of the inner lead portion face towards one another, the inner lead portion extends within and outside a periphery of the second chip, the outer lead portion is disposed outside the periphery of the second chip and the first chip vertically overlaps the second chip;
  a first insulative adhesive that contacts and is sandwiched between the second surface of the first chip and the first surface of the inner lead portion;
  a second insulative adhesive that contacts and is sandwiched between the first surface of the second chip and the second surface of the inner lead portion;
  a first wire bond that contacts and electrically connects the first pad and the first surface of the inner lead portion, wherein the first wire bond extends vertically beyond the first chip in the first and second directions, is disposed vertically beyond the second chip in the first direction, extends within and outside the peripheries of the first and second chips, contacts the inner lead portion at a first bond site outside the peripheries of the first and second chips and extends vertically beyond the inner lead portion in the first direction but not the second direction;
  a second wire bond that contacts and electrically connects the second pad and the first surface of the inner lead portion, wherein the second wire bond is disposed vertically beyond the first chip in the second direction, extends vertically beyond the second chip in the first direction but not the second direction, is disposed within the peripheries of the first and second chips, contacts the inner lead portion at a second bond site within the peripheries of the first and second chips, extends vertically beyond the inner lead portion in the first and second directions and contacts the first adhesive, and the first bond site is laterally spaced from and coplanar with the second bond site; and
  an encapsulant that contacts the first and second chips, the first and second adhesives and the first wire bond.

32. The stacked package of claim 31, wherein the second surface of the second chip is laterally aligned with the encapsulant and exposed.

33. The stacked package of claim 31, wherein the first adhesive contacts the second chip and the second adhesive, is spaced from the first wire bond and vertically overlaps the second pad.

34. The stacked package of claim 33, wherein the second adhesive is spaced from the first and second wire bonds.

35. The stacked package of claim 33, wherein the encapsulant is spaced from the second wire bond.

36. The stacked package of claim 31, wherein the first adhesive is spaced from the second chip and the first wire bond and does not vertically overlap the second pad.

37. The stacked package of claim 36, wherein the second adhesive is spaced from the first and second wire bonds.

38. The stacked package of claim 36, wherein the encapsulant contacts the second wire bond.

39. The stacked package of claim 31, wherein the second wire bond is spaced from the second adhesive.

40. The stacked package of claim 31, wherein the encapsulant is a single-piece insulative material that covers and extends vertically beyond the first and second chips, the first and second adhesives and the first and second wire bonds in the first direction.

41. A three-dimensional stacked semiconductor package, comprising:
  a lead that includes an inner lead portion, an outer lead portion, an inner distal end, an outer distal end and first and second opposing surfaces, wherein the inner lead portion is adjacent to the inner distal end, spaced from the outer distal end and is flat, the outer lead portion is adjacent to the outer distal end, spaced from the inner distal end and is bent, the inner and outer lead portions are adjacent to and integral with one another, the first surface of the lead faces in a first direction, the second surface of the lead faces in a second direction opposite the first direction, and the first and second surfaces of the lead extend across the inner and outer lead portions;

a first semiconductor chip that includes first and second opposing surfaces, wherein the first surface of the first chip includes a first conductive pad, the first surface of the first chip faces in the first direction, the second surface of the first chip faces in the second direction, the first chip is disposed vertically beyond the inner lead portion in the first direction, the second surface of the first chip and the first surface of the inner lead portion face towards one another, the inner lead portion extends within and outside a periphery of the first chip and the outer lead portion is disposed outside the periphery of the first chip;

a second semiconductor chip that includes first and second opposing surfaces, wherein the first surface of the second chip includes a second conductive pad, the first surface of the second chip faces in the first direction, the second surface of the second chip faces in the second direction, the second chip is disposed vertically beyond the inner lead portion in the second direction, the first surface of the second chip and the second surface of the inner lead portion face towards one another, the inner lead portion extends within and outside a periphery of the second chip, the outer lead portion is disposed outside the periphery of the second chip and the first chip vertically overlaps the second chip;

a first insulative adhesive that contacts and is sandwiched between the second surface of the first chip and the first surface of the inner lead portion;

a second insulative adhesive that contacts and is sandwiched between the first surface of the second chip and the second surface of the inner lead portion, wherein the first adhesive is substantially thicker than the second adhesive;

a first wire bond that contacts and electrically connects the first pad and the first surface of the inner lead portion, wherein the first wire bond extends vertically beyond the first chip in the first and second directions, is disposed vertically beyond the second chip in the first direction, extends within and outside the peripheries of the first and second chips, contacts the inner lead portion at a first bond site outside the peripheries of the first and second chips and extends vertically beyond the inner lead portion in the first direction but not the second direction, and the first and second adhesives are spaced from the first wire bond;

a second wire bond that contacts and electrically connects the second pad and the first surface of the inner lead portion, wherein the second wire bond is disposed vertically beyond the first chip in the second direction, extends vertically beyond the second chip in the first direction but not the second direction, is disposed within the peripheries of the first and second chips, contacts the inner lead portion at a second bond site within the peripheries of the first and second chips, extends vertically beyond the inner lead portion in the first and second directions, contacts the first adhesive and is spaced from the second adhesive, and the first bond site is laterally spaced from and coplanar with the second bond site; and an encapsulant that contacts the first and second chips, the first and second adhesives and the first wire bond.

42. The stacked package of claim 41, wherein the second surface of the second chip is laterally aligned with the encapsulant and exposed.

43. The stacked package of claim 41, wherein the first adhesive contacts the second chip and vertically overlaps the second pad and the encapsulant is spaced from the second wire bond.

44. The stacked package of claim 41, wherein the first adhesive does not vertically overlap the second pad and the encapsulant contacts the second wire bond.

45. The stacked package of claim 41, wherein the encapsulant is a single-piece insulative material that covers and extends vertically beyond the first and second chips, the first and second adhesives and the first and second wire bonds in the first direction.

46. A three-dimensional stacked semiconductor package, comprising:

a lead that includes an inner lead portion, an outer lead portion, an inner distal end, an outer distal end and first and second opposing surfaces, wherein the inner lead portion is adjacent to the inner distal end and spaced from the outer distal end, the outer lead portion is adjacent to the outer distal end and spaced from the inner distal end, the inner and outer lead portions are adjacent to and integral with one another, the first surface of the lead faces in a first direction, the second surface of the lead faces in a second direction opposite the first direction, and the first and second surfaces of the lead extend across the inner and outer lead portions;

a first semiconductor chip that includes first and second opposing surfaces, wherein the first surface of the first chip includes a first conductive pad, the first surface of the first chip faces in the first direction, the second surface of the first chip faces in the second direction, the first chip is disposed vertically beyond the inner lead portion in the first direction, the second surface of the first chip and the first surface of the inner lead portion face towards one another, the inner lead portion extends within and outside a periphery of the first chip and the outer lead portion is disposed outside the periphery of the first chip;

a second semiconductor chip that includes first and second opposing surfaces, wherein the first surface of the second chip includes a second conductive pad, the first surface of the second chip faces in the first direction, the second surface of the second chip faces in the second direction, the second chip is disposed vertically beyond the inner lead portion in the second direction, the first surface of the second chip and the second surface of the inner lead portion face towards one another, the inner lead portion extends within and outside a periphery of the second chip, the outer lead portion is disposed outside the periphery of the second chip and the first chip vertically overlaps the second chip;

a first insulative adhesive that contacts and is sandwiched between the second surface of the first chip and the first surface of the inner lead portion;

a second insulative adhesive that contacts and is sandwiched between the first surface of the second chip and the second surface of the inner lead portion;

a first wire bond that contacts and electrically connects the first pad and the first surface of the inner lead portion, wherein the first wire bond extends vertically beyond the first chip in the first and second directions, is disposed vertically beyond the second chip in the first direction, extends within and outside the peripheries of the first and second chips, contacts the inner lead portion at a first bond site outside the peripheries of the first and second chips and extends vertically beyond the inner lead portion in the first direction but not the second direction;

a second wire bond that contacts and electrically connects the second pad and the first surface of the inner lead portion, wherein the second wire bond is disposed vertically beyond the first chip in the second direction, extends vertically beyond the second chip in the first direction but not the second direction, is disposed within the peripheries of the first and second chips, contacts the inner lead portion at a second bond site within the peripheries of the first and second chips and extends vertically beyond the inner lead portion in the first and second directions, and the first bond site is laterally spaced from and coplanar with the second bond site; and an encapsulant that contacts the first and second chips, the first and second adhesives and the first wire bond and is spaced from the second wire bond.

47. The stacked package of claim 46, wherein the first adhesive is spaced from the first wire bond and contacts the second wire bond.

48. The stacked package of claim 47, wherein the first adhesive covers and extends vertically beyond the second wire bond in the first direction.

49. The stacked package of claim 48, wherein the first adhesive contacts and is sandwiched between the lead and the second wire bond, contacts and is sandwiched between the first chip and the second chip, contacts and is sandwiched between the first chip and the second wire bond, contacts and is sandwiched between the second chip and the second wire bond, and contacts and is sandwiched between the second adhesive and the second wire bond.

50. The stacked package of claim 49, wherein the encapsulant is a single-piece insulative material that covers and extends vertically beyond the first and second chips, the first and second adhesives and the first and second wire bonds in the first direction.

51. A three-dimensional stacked semiconductor package, comprising:

a lead that includes an inner lead portion, an outer lead portion, an inner distal end, an outer distal end and first and second opposing surfaces, wherein the inner lead portion is adjacent to the inner distal end and spaced from the outer distal end, the outer lead portion is adjacent to the outer distal end and spaced from the inner distal end, the inner and outer lead portions are adjacent to and integral with one another, the first surface of the lead faces in a first direction, the second surface of the lead faces in a second direction opposite the first direction, and the first and second surfaces of the lead extend across the inner and outer lead portions;

a first semiconductor chip that includes first and second opposing surfaces, wherein the first surface of the first chip includes a first conductive pad, the first surface of the first chip faces in the first direction, the second surface of the first chip faces in the second direction, the first chip is disposed vertically beyond the inner lead portion in the first direction, the second surface of the first chip and the first surface of the inner lead portion face towards one another, the inner lead portion extends within and outside a periphery of the first chip and the outer lead portion is disposed outside the periphery of the first chip;

a second semiconductor chip that includes first and second opposing surfaces, wherein the first surface of the second chip includes a second conductive pad, the first surface of the second chip faces in the first direction, the second surface of the second chip faces in the second direction, the second chip is disposed vertically beyond the inner lead portion in the second direction, the first surface of the second chip and the second surface of the inner lead portion face towards one another, the inner lead portion extends within and outside a periphery of the second chip, the outer lead portion is disposed outside the periphery of the second chip and the first chip vertically overlaps the second chip;

a first insulative adhesive that contacts and is sandwiched between the second surface of the first chip and the first surface of the inner lead portion and covers and extends vertically beyond the second pad in the first direction;

a second insulative adhesive that contacts and is sandwiched between the first surface of the second chip and the second surface of the inner lead portion;

a first wire bond that contacts and electrically connects the first pad and the first surface of the inner lead portion, wherein the first wire bond extends vertically beyond the first chip in the first and second directions, is disposed vertically beyond the second chip in the first direction, extends within and outside the peripheries of the first and second chips, contacts the inner lead portion at a first bond site outside the peripheries of the first and second chips and extends vertically beyond the inner lead portion in the first direction but not the second direction;

a second wire bond that contacts and electrically connects the second pad and the first surface of the inner lead portion, wherein the second wire bond is disposed vertically beyond the first chip in the second direction, extends vertically beyond the second chip in the first direction but not the second direction, is disposed within the peripheries of the first and second chips, contacts the inner lead portion at a second bond site within the peripheries of the first and second chips and extends vertically beyond the inner lead portion in the first and second directions, and the first bond site is laterally spaced from and coplanar with the second bond site; and an encapsulant that contacts the first and second chips, the first and second adhesives and the first wire bond.

52. The stacked package of claim 51, wherein the first adhesive is spaced from the first wire bond and contacts the second wire bond.

53. The stacked package of claim 52, wherein the first adhesive covers and extends vertically beyond the second wire bond in the first direction.

54. The stacked package of claim 53, wherein the first adhesive contacts and is sandwiched between the lead and the second wire bond, contacts and is sandwiched between the first chip and the second chip, contacts and is sandwiched between the first chip and the second wire bond, contacts and is sandwiched between the second chip and the second wire bond, and contacts and is sandwiched between the second adhesive and the second wire bond.

55. The stacked package of claim 54, wherein the encapsulant is a single-piece insulative material that covers and extends vertically beyond the first and second chips, the first and second adhesives and the first and second wire bonds in the first direction.

56. A three-dimensional stacked semiconductor package, comprising:
- a lead that includes an inner lead portion, an outer lead portion, an inner distal end, an outer distal end and first and second opposing surfaces, wherein the inner lead portion is adjacent to the inner distal end and spaced from the outer distal end, the outer lead portion is adjacent to the outer distal end and spaced from the inner distal end, the inner and outer lead portions are adjacent to and integral with one another, the first surface of the lead faces in a first direction, the second surface of the lead faces in a second direction opposite the first direction, and the first and second surfaces of the lead extend across the inner and outer lead portions;
- a first semiconductor chip that includes first and second opposing surfaces, wherein the first surface of the first chip includes a first conductive pad, the first surface of the first chip faces in the first direction, the second surface of the first chip faces in the second direction, the first chip is disposed vertically beyond the inner lead portion in the first direction, the second surface of the first chip and the first surface of the inner lead portion face towards one another, the inner lead portion extends within and outside a periphery of the first chip and the outer lead portion is disposed outside the periphery of the first chip;
- a second semiconductor chip that includes first and second opposing surfaces, wherein the first surface of the second chip includes a second conductive pad, the first surface of the second chip faces in the first direction, the second surface of the second chip faces in the second direction, the second chip is disposed vertically beyond the inner lead portion in the second direction, the first surface of the second chip and the second surface of the inner lead portion face towards one another, the inner lead portion extends within and outside a periphery of the second chip, the outer lead portion is disposed outside the periphery of the second chip and the first chip vertically overlaps the second chip;
- a first insulative adhesive that contacts and is sandwiched between the second surface of the first chip and the first surface of the inner lead portion;
- a second insulative adhesive that contacts and is sandwiched between the first surface of the second chip and the second surface of the inner lead portion;
- a first wire bond that contacts and electrically connects the first pad and the first surface of the inner lead portion, wherein the first wire bond extends vertically beyond the first chip in the first and second directions, is disposed vertically beyond the second chip in the first direction, extends within and outside the peripheries of the first and second chips, contacts the inner lead portion at a first bond site outside the peripheries of the first and second chips and extends vertically beyond the inner lead portion in the first direction but not the second direction;
- a second wire bond that contacts and electrically connects the second pad and the first surface of the inner lead portion, wherein the second wire bond is disposed vertically beyond the first chip in the second direction, extends vertically beyond the second chip in the first direction but not the second direction, is disposed within the peripheries of the first and second chips, contacts the inner lead portion at a second bond site within the peripheries of the first and second chips and extends vertically beyond the inner lead portion in the first and second directions, the first bond site is laterally spaced from and coplanar with the second bond site and the first adhesive covers and extends vertically beyond the second bond site in the first direction; and
- an encapsulant that contacts the first and second chips, the first and second adhesives and the first wire bond.

57. The stacked package of claim 56, wherein the first adhesive is spaced from the first wire bond and contacts the second wire bond.

58. The stacked package of claim 57, wherein the first adhesive covers and extends vertically beyond the second wire bond in the first direction.

59. The stacked package of claim 58, wherein the first adhesive contacts and is sandwiched between the lead and the second wire bond, contacts and is sandwiched between the first chip and the second chip, contacts and is sandwiched between the first chip and the second wire bond, contacts and is sandwiched between the second chip and the second wire bond, and contacts and is sandwiched between the second adhesive and the second wire bond.

60. The stacked package of claim 59, wherein the encapsulant is a single-piece insulative material that covers and extends vertically beyond the first and second chips, the first and second adhesives and the first and second wire bonds in the first direction.

* * * * *